United States Patent
Ishimi

[11] Patent Number: 6,157,226
[45] Date of Patent: Dec. 5, 2000

[54] CLOCK GENERATOR

[75] Inventor: Kouichi Ishimi, Tokyo, Japan

[73] Assignee: Mitsubishi Denki Kabushiki Kaisha, Tokyo, Japan

[21] Appl. No.: 09/072,499

[22] Filed: May 5, 1998

Related U.S. Application Data

[63] Continuation-in-part of application No. 08/969,561, Nov. 13, 1997.

[30] Foreign Application Priority Data

May 23, 1997 [JP] Japan ................................. 9-134188
Jan. 23, 1998 [JP] Japan ................................. 10-011847

[51] Int. Cl.[7] ....................................................... H03K 5/13
[52] U.S. Cl. .......................... 327/116; 327/158; 327/159
[58] Field of Search .................................... 327/114, 116, 327/119, 122, 356, 291, 299, 147, 149, 150, 153, 156, 158, 159, 161

[56] References Cited

U.S. PATENT DOCUMENTS

| | | | |
|---|---|---|---|
| 4,691,170 | 9/1987 | Riley | 327/114 |
| 5,461,332 | 10/1995 | Mirov et al. | 327/41 |
| 5,687,202 | 11/1997 | Eitrheim | 375/376 |
| 5,771,264 | 6/1998 | Lane | 375/376 |

FOREIGN PATENT DOCUMENTS

| | | |
|---|---|---|
| 0762262 | 3/1997 | European Pat. Off. . |
| 63-276922 | 11/1988 | Japan . |
| 119826 | 1/1989 | Japan . |

OTHER PUBLICATIONS

Combes, Michael, et al. "A Portable Clock Multiplier Generator Using Digital CMOS Standard Cells." *IEEE Journal of Solid–State Circuits* 31.7 (1996): 958–965.

Efendovich, Avner, et al. "Multifrequency Zero–Jitter Delay–Locked Loop." *IEEE Journal of Solid–State Circuits* 1.29 (1994): 67–70.

*Primary Examiner*—Tuan T. Lam
*Attorney, Agent, or Firm*—Leydig, Voit & Mayer, Ltd.

[57] ABSTRACT

In a multiplying circuit for providing a pulsed output clock signal have a frequency that is a multiple of a pulsed input clock signal, a delay of a digital delay line is initialized by initializing a counter when an external reset signal is input and when the number of pulses of the output clock signal from the clock generator is smaller than a predetermined multiplier. The delay of the digital delay line is set to a minimum value immediately following the initialization and then increased gradually in order to output the desired output clock signal.

8 Claims, 8 Drawing Sheets

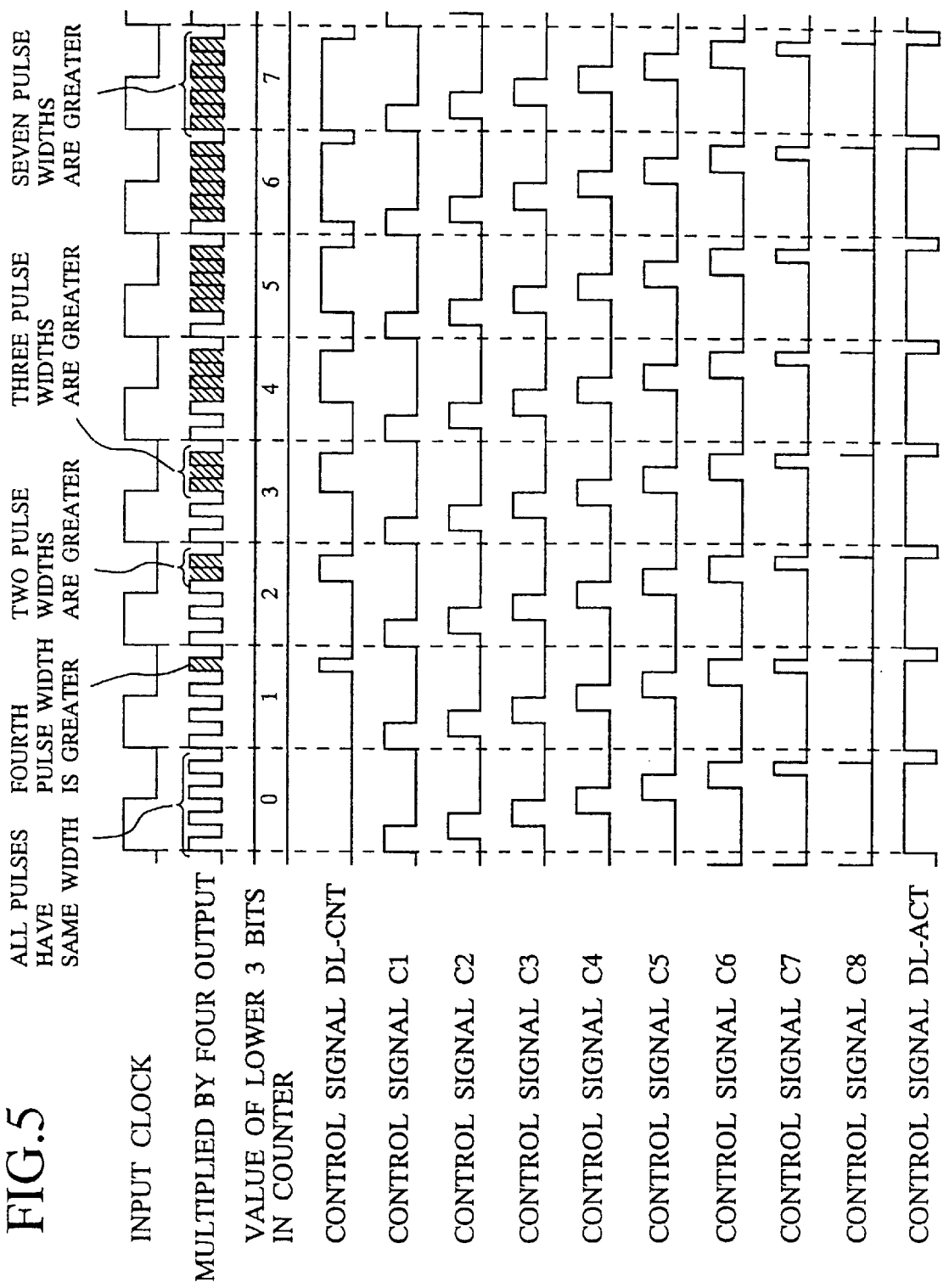

CLOCK GENERATOR

This is a continuation-in-part of application Ser. No. 08/969,561, filed Nov. 13, 1997.

BACKGROUND OF THE INVENTION

1. Field of the Invention

The present invention relates to a clock generator capable of performing operation accurately and being freedom from noise effects, and may be controlled at a low voltage.

2. Description of the Prior Art

A PLL (a phase Locked Loop) has been widely used in many electrical fields. The PLL is a circuit to output multiple clock signals in synchronization with an input clock signal.

Recent microprocessors operate in a higher operation frequency, for example, in a higher clock of several hundreds MHz, so that incorporating of the PLL is indispensable to the microprocessors.

The type of conventional PLLs is an analogue type to control an oscillating frequency by controlling the voltage of a capacitor to store an control voltage of a Voltage Control Oscillator (VCO) based on a charge pump.

However, it is difficult to operate the conventional analogue type PLL under a low voltage and noises greatly affect on the operation of the conventional PLL. Furthermore, it takes many times for the conventional PLL to reach a stable state and the PLL stops the oscillation when once the supply of the input clock is halted and it take a long time period to restart the operation of the PLL.

In order to eliminate and to solve the drawbacks or the problems described above, conventional techniques provided various methods. For example, the following conventional literature 1 discloses a frequency multiplier generator using digital delay lines.

Literature 1: "A Portable Clock Multiplier generator Using Digital CMOS Standard Cells", Michel Combes, Karim Dioury, and Alain Greiner, IEEE Journal of Solid State Circuits, Vol. 31, No. 7, July, 1996.

FIG. 8 is a block diagram showing the configuration of a conventional frequency multiplier. In FIG. 8, the reference number 1 designates a flip flop circuit, 2 denotes a divider, 3 indicates a comparator, 4 designates a control circuit, and 6 and 7 indicate delay circuits, respectively. FIG. 9 is a timing chart showing the operation of the conventional frequency multiplier 10 shown in FIG. 8.

Next, a description will now be given of the operation of the conventional frequency multiple circuit.

In the operation of the conventional frequency multiple circuit 10, there is a possibility to enter a state that the F/F circuit outputs no pulse under the initial state of a delay time of both the delay circuits 6 and 7 as the digital delay line during one period of the timing T1 to the timing T2, as shown in the timing chart of FIG. 9. In this case, there is a drawback that the F/F 1 outputs no multiplied output signal accurately during the one period from the timing T1 to the timing T2 of the input clock shown in FIG. 9 because the output signal M of the divider 2 is asserted during this one period based on a difference between a delay time from the rising edge (Timing T1) of the input clock to the time to negate the output signal M of the divider 2 and a delay time from a falling edge (Timing T1) in the fourth pulse of the multiplied clock output signal as the output signal of the F/F 1 to a time to assert the output signal M of the divider 2.

In addition, the literature 1 showing the frequency multiple circuit 10 as the conventional technique described above has described no phase lock between the input clock and the output signal M of the divider 2. Therefore the literature 1 provides the PLL having an insufficient function.

On the other hand, there is a conventional technique that is obtained by combining a phase locked circuit with the frequency multiple circuit 10 using the digital delay line shown in FIG. 8.

FIG. 10 is a block diagram showing a conventional clock generation circuit 15 that is obtained by combining the phase locked circuit with the frequency multiple circuit 10 using the digital delay line shown in FIG. 8. In FIG. 10, the reference number 10 designates the frequency multiple circuit shown in FIG. 8, 11 denotes a phase locked circuit, 12 indicates a digital delay line forming the phase locked circuit 11, 13 designates a digital counter, and 14 denotes a comparator.

Next, the operation of the conventional clock generation circuit will be explained.

The multiplied clock output signal (or an output clock) provided from the frequency multiple circuit 10 is inputted into the digital delay line 12 in the phase locked circuit 11, then the digital delay line 12 outputs a PLL output signal to outside. The comparator 14 compares the phase of the PLL output signal with the phase of the input clock, and outputs the comparison result to the digital delay line 12 as a feedback signal in order to adjust a delay between both the input clock and the PLL output signal and to coincide the input clock with the PLL output signal in phase.

However, the conventional clock generation circuit 15 having the configuration shown in FIG. 10 has a drawback in which a compensation ability to compensate a delay of the PLL output signal caused by the influence of a voltage value, a temperature value, and so on becomes bad, because it takes many times to reflect the compensation of the period and the phase based on the comparison result obtained by the comparator 3 in the frequency multiple circuit 10 or the comparator 14 in the phase locked circuit 11 when the delay time of the digital delay line 12 becomes longer than the period of the input clock, for example.

FIG. 11 is a timing chart showing the operation of the conventional clock generation circuit 15 shown in FIG. 10. As shown in the timing chart of FIG. 11, when the delay time of the digital delay line 12 in the conventional clock generator 15 is locked in the delay time of twice of the period of the input clock, the comparison result that has been output at the timing T1 from the comparator 3 incorporated in the frequency multiple circuit 10 is output firstly by the phase locked circuit 11 as the PLL output signal only after two periods of the input clock counted from the timing T4. This causes the possibility to decrease the compensation ability and to happen that the delay compensation operation process can not be executed correctly because an incorrect PLL output signal will be generated at the timing T5.

FIG. 12 is a block diagram showing the configuration of the conventional digital delay line 12. In FIG. 12, the reference number 17 indicates a plurality of delay elements forming the digital delay line 12, 18 indicates a selector to select one of the plurality of delay elements 17.

For example, in the techniques disclosed in the literature 1 described above and the following literature 2, the selector 18 selects one of the delay elements 17 in order to adjust the delay time.

Literature 2s: "Multifrequency Zero-Jitter Delay-Locked Loop"; Avner Efendovich, et al., IEEE Journal of Solid-State Circuits, Vol. 19, No. 1, January, 1994.

However, it must be required in the conventional digital delay line having this configuration to switch the entire delay elements 17 even if a delay time of the digital delay line is shorter. This causes to consume un-required electric power.

FIG. 13 is a diagram showing the configuration of another conventional digital delay line. As shown in FIG. 13, the position of an input terminal is changed by using control signals "a" and "b" so that each delay element is selectively activated in order to obtain a desired delay time and also to reduce the power consumption of the digital delay line. However, there is a drawback in the configuration of the digital delay line shown in FIG. 13. For example, when a counter value is changed while the clock generation circuit is operating, namely, when the position of the input terminal is shifted from the node "a" to the node "b", there is a drawback that unstable electric potential is added on the output "a" at the timing T8 shown in FIG. 14.

As described above, there is the drawback that in the digital PLL using the digital delay line incorporated in the conventional clock generation circuit, a following phase comparison is performed before the change of the delay time of the digital delay line is reflected to the PLL output signal under an initial state of the multiplied clock output signal as the output signal of the frequency multiple circuit 10, so that the compensation ability to the change of the temperature and the voltage becomes reduced and it becomes difficult to perform the phase lock operation. Furthermore, when all of the delay elements in the digital delay line are switched, the conventional clock generation circuit consumes un-necessary power consumption. Moreover, in the case that the input position of the digital delay line is shifted in order to avoid this un-necessary power consumption, it is difficult to lock the phase accurately when the counter value is changed because a hazard is generated on the output of the digital delay line.

SUMMARY OF THE INVENTION

Accordingly, an object of the present invention is, with due consideration to the drawbacks of the conventional clock generator, to provide a clock generator whose operation is easily controlled under a low voltage and capable of being free from noises and capable of generating desired clocks even if the supply of input clocks is halted and the period of a lock time is short.

In accordance with a preferred embodiment of the present invention, a clock generator comprises a multiple circuit for receiving an input clock signal and for generating and outputting an output clock signal of a desired multiplied clock signal, wherein an operation of the multiple circuit is initialized when a reset signal is transferred from outside or when the number of the output clock signals provided from the multiple circuit during one period of the input clock signal is less than a predetermined multiple number. It is thereby possible to generate a desired multiplied output clock signal accurately and certainly even if the counter value of the counter has any initial value.

In accordance with a preferred embodiment of the present invention, a clock generator comprising a multiple circuit for receiving an input clock signal and for generating and outputting an output clock signal of a desired multiplied clock signal. In the clock generator, the multiple circuit comprises a first delay circuit for delaying a period or a phase of the output clock signal gradually and a first counter for setting the delay time of the first delay circuit and for controlling an operation of the first delay circuit wherein the counter value in the first counter is set so that the delay time of the first delay circuit has the minimum value when the operation of the clock generator is initiated or receives a reset signal provided from external. It is thereby possible to generate a desired multiplied output clock signal accurately and certainly In the clock generator as the preferred embodiment described above, the counter value of the first counter is updated into the minimum value by which a change of the delay time of the first delay circuit has the minimum value. It is also thereby possible to generate a desired multiplied output clock signal accurately and certainly In accordance with a preferred embodiment of the present invention, a clock generator comprises a multiple circuit for receiving an input clock signal and for generating and outputting an output clock signal of a desired multiplied clock signal, the multiple circuit comprising a first delay circuit for delaying a period or a phase of the output clock signal gradually, and a first counter for setting the delay time of the first delay circuit and for controlling an operation of the first delay circuit, a phase locked circuit comprising, a second delay circuit for receiving the output clock signal provided from the first delay circuit in the multiple circuit and for delaying the output clock signal by a predetermined time length, and a second counter for setting and controlling the delay time length of the second delay circuit. In the clock generator, the multiple circuit further comprises a third counter in which a second value is set when the initial value of the third counter is the first value and the counter value in the first counter is not changed during a predetermined time period, wherein the counter value of the third counter is changed from the first value to the second value, the counter value of the second counter is set so that the delay time of the second delay circuit becomes equal to or longer than the delay time of the first delay circuit. It is thereby possible to increase the accuracy of the phase lock operation.

In accordance with another preferred embodiment of the present invention, a clock generator comprises a first delay circuit and a second delay circuit, each of the first delay circuit and the second delay circuit comprising a plurality of delay elements connected to each other in series. In this clock generator, one of the plurality of delay elements is selected according to counter values transferred from a first flip flop circuit and a second flip flop circuit corresponding to the first delay circuit and the second delay circuit, and a delay time of each of the first delay circuit and the second delay circuit is determined by the selected delay element and an adjacent delay element next to the selected delay element. It is thereby possible to avoid an occurrence of a failure operation by setting a delay time of a selected delay element and the adjacent delay element of the selected one and to reduce the power consumption of the clock generator and a delay locked loop (DLL).

In the clock generator as another preferred embodiment of the present invention described above, each of the plurality of delay elements comprises two circuits connected in parallel, each of the two circuits comprises n PMOS transistors (n is a positive integer) connected in series and n NMOS transistors connected in series, and gates of a P MOS transistor and a NMOS transistor adjacent to a connection node of both the n PMOS transistors and the n NMOS transistors are connected to each other.

In the clock generator as another preferred embodiment of the present invention described above, each of the first counter and the second counter comprises flip flop circuits and the third counter comprises a flip flop circuit of one bit.

BRIEF DESCRIPTION OF THE DRAWINGS

These and other objects, features, aspects and advantages of the present invention will become more apparent from the following detailed description of the present invention when taken in conjunction with the accompanying drawings, in which:

FIG. 5 is a timing chart showing the relationship among a lower 3-bit value of a counter in a multiple section, each control signal, and a four-multiplied output from the delay fine-adjustment circuit.

DESCRIPTION OF THE PREFERRED EMBODIMENTS

Other features of this invention will become apparent through the following description of preferred embodiments which are given for illustration of the invention and are not intended to be limiting thereof.

The preferred embodiment of the clock generator according to the present invention will now be described with reference to the drawings.

Embodiment

Figure 1:
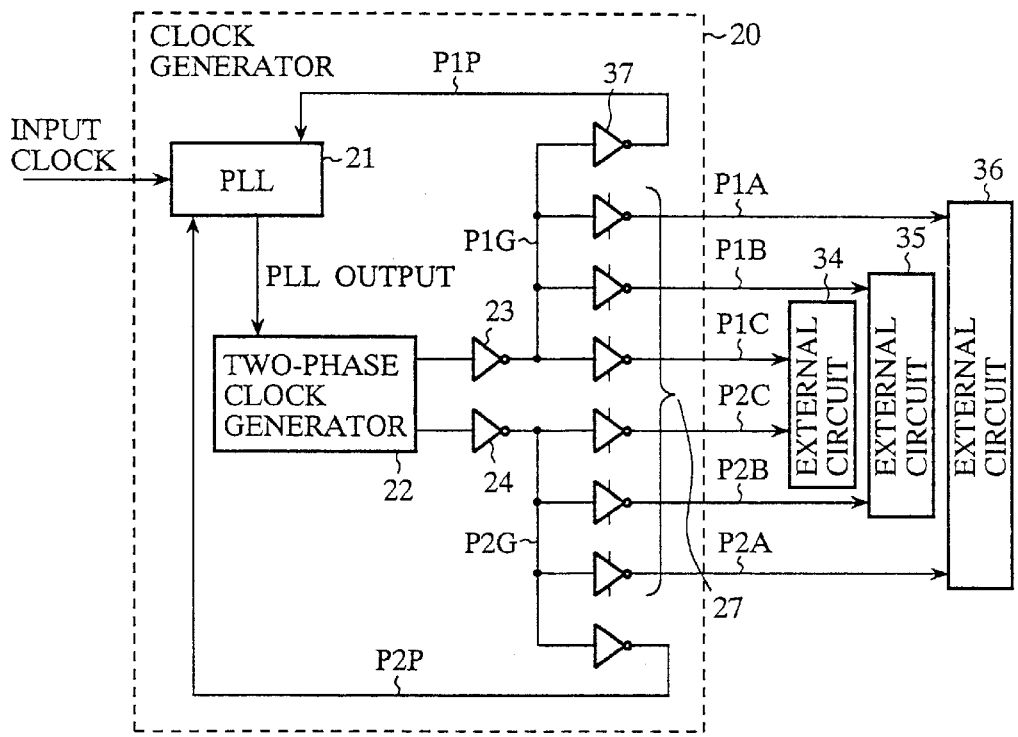
FIG. 1 is a block diagram showing the configuration of a clock generator as a preferred embodiment according to the present invention.

FIG. 1 is a block diagram showing the configuration of a clock generator as a preferred embodiment according to the present invention. In FIG. 1, the reference number 21 designates a Phase Locked Loop (hereinafter, referred to as PLL for brevity), 22 denotes a two-phase clock generator, 23, 24, and 37 indicate invertors, 27 designates a clock driver comprising a gate control inverter, and 34, 35, and 36 indicate external circuits to which the clock signals generated by the clock generator 20 according to the embodiment will be provided. The clock generator 20 comprises the PLL 21, the two-phase clock generator 22, the inverter 23 and 24, and the clocked driver 27.

Next, a description will be given of the operation of the clock generator of the embodiment.

The PLL 21 incorporated in the clock generator 20 of the embodiment according to the present invention outputs a PLL output signal (or PLL output) as a four-multiplied clock signal of the input signal (hereinafter, referred to as input clock). This PLL output signal is changed to two-phase non-overlapped signals P1G and P2G, that are not overlapped, by the two-phase clock generator circuit 22. These two-phase non-overlapped signals P1G and P2G are supplied to both the external circuits 34, 35, and 36, respectively, through the clocked driver 27 in each block.

For example, the output signals P1A and P2A from the clocked drivers 27 are transferred to the external circuit 36, the output signals P1B and P2B from the clocked drivers 27 are transferred to the external circuit 35, and the output signals P1C and P2C from the clocked drivers 27 are transferred to the external circuit 34.

When the level of output from the external circuit 34 is not changed, namely, when the external circuit 34 is inactive, the level of the output signals P1C and P2C from the clocked driver 27 are set to a low level (L level) in potential. Similarly, when the output level transferred from the external circuit 36 is not changed, namely, when the external circuit 36 is inactive, the level of the output signals P1A and P2A from the clocked driver 27 are set to the L level in voltage potential and then transferred to the external circuit 36.

The PLL 21 has the function that is capable of controlling the output level of the PLL itself so that the phase of the clock input becomes equal to the phase of the output of the inverter 37.

Figure 2:
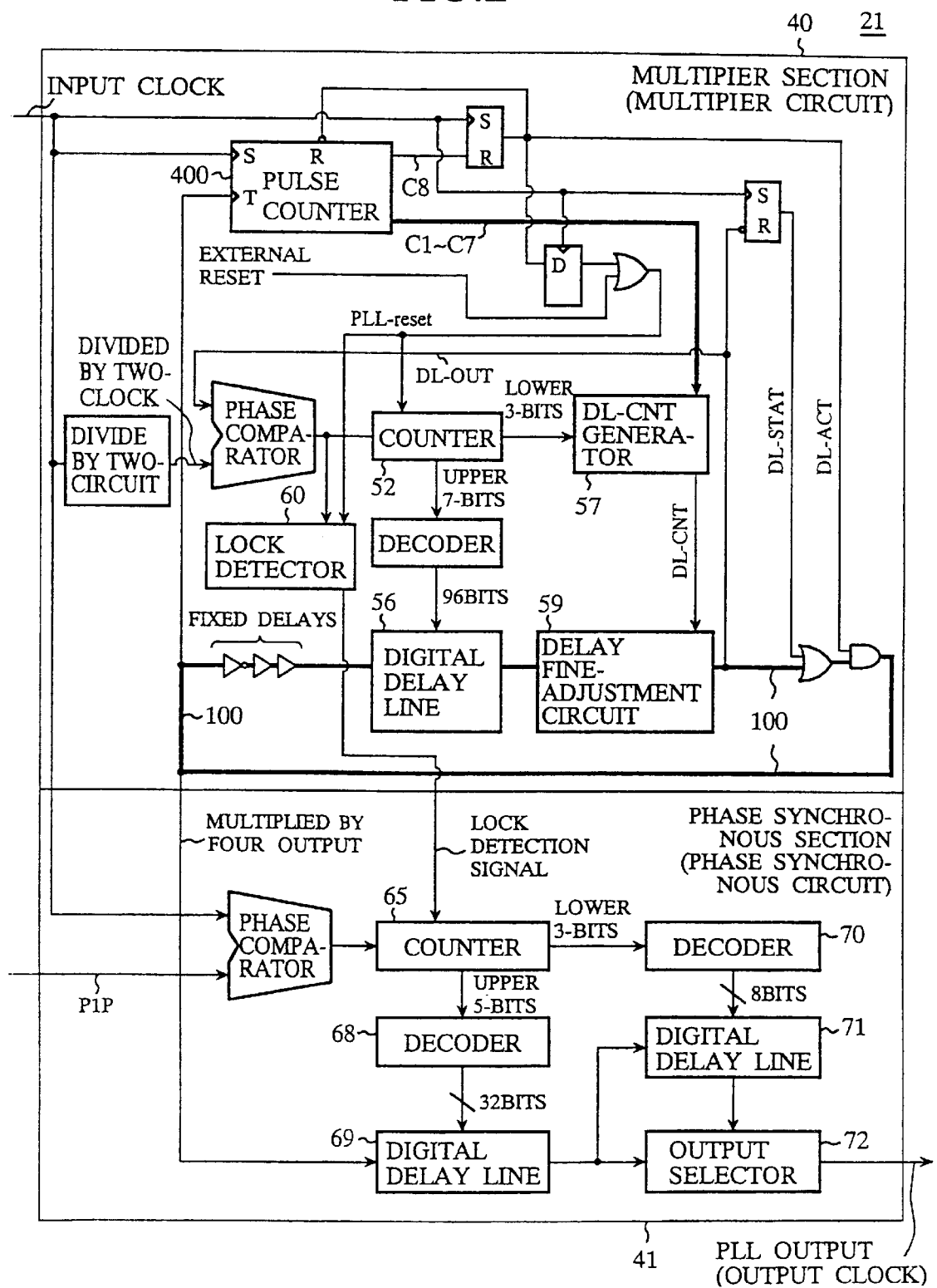
FIG. 2 is a block diagram of the configuration of PLL incorporated in the clock generator shown in FIG. 1

FIG. 2 is a block diagram of the configuration of the PLL incorporated in the clock generator shown in FIG. 1. The PLL comprises both the multiple circuit 40 and the phase locked circuit 41 (hereinafter it is also referred to as a phase locked section 41).

Hereinafter, the configuration and operation of the multiple circuit 40 and the phase locked section 41 forming the PLL 21 will be explained in detail.

The multiple section 40 has the function to generate a four-multiplied clock of the input clock. The multiple section 40 generates the four-multiplied clock in this embodiment, but the present invention is not limited by this case, for example, it is acceptable that the PLL generates a desired multiplied clock such as a two-multiplied clock, a six-multiplied clock, an eight multiplied clock, and the like.

Next, the operation of the multiple section 40 will be explained.

Figure 3:
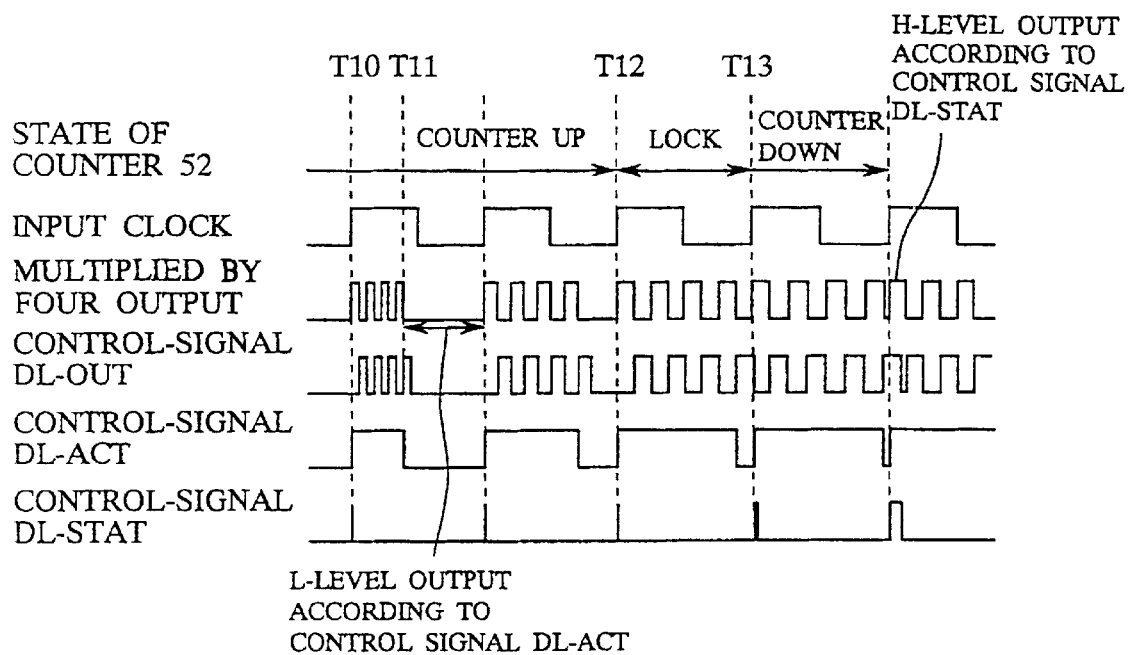
FIG. 3 is a timing chart showing the operation of PLL.

FIG. 3 is a timing chart showing the operation of the PLL 21. In the multiple section 40 shown in FIG. 2, the solid loop shows the ring-oscillator 100. The multiple section 40 outputs the four-multiplied clock generated by the ring oscillator 100 to the phase locked section 41. Specifically, the output of this ring oscillator 100 is set to the L level while the control signal DL-ACT is negated directly and is set to the H level while the control signal DL-START is asserted (for example, timing T10), and is asserted while the control signal DL-STAT is asserted.

As shown in the timing chart of FIG. 3, the control signal DL-ACT is asserted at a rising edge of the input clock (for example, at the timing T10) and negated at a falling edge of the fourth pulse (for example, at the timing T11).

The digital delay line 56 (first delay circuit) comprises 96 delay elements (for example, selectors) connected in series through which the delay time may be adjusted by 96 stages. For example, the upper 7 bits in the 10 bit counter 52 (a first counter) may control the delay time of the digital delay line 56. The initial value of the counter 52 is one when the control signal PLL-reset is asserted. This controls to set the delay time of the digital delay line 56 into the minimum value. The value of the counter is counted up every two periods of the input clock.

At the timing when the rising edge of the input clock is equal in timing to the falling edge of the control signal DL-OUT at the timing T13 following after the timing T12, the count-up operation for the counter 52 is halted. Thus, because the counter 52 can set the delay time of the digital delay line 56 from the minimum value to the maximum value gradually, it can be avoided for the clock generator to enter the bad state in which a desired multiplied output signal is not generated by continuously asserting the output signal from the divider, this state has been explained in the prior art section in this specification.

For example, when the control signal DL-ACT is asserted at the rising edge of the input clock, the multiple circuit 40 judges whether four pulses of the four-multiplied output are not output during the one period of the input clock, and asserts the control signal PLL-reset and resets the value of the counter 52. Thereby, even if the operation of the PLL 21 is in an unstable state in an initial state immediately following the electrical power ON, the operation of the PLL 21 may be reset certainly.

In addition, the control signal PLL-reset may be asserted by using an external reset signal that is provided from external devices. This external reset signal is generated by using a reset input signal that is provided from an external device of a semiconductor chip or by a power on reset signal arrested at the power ON.

Figure 4:
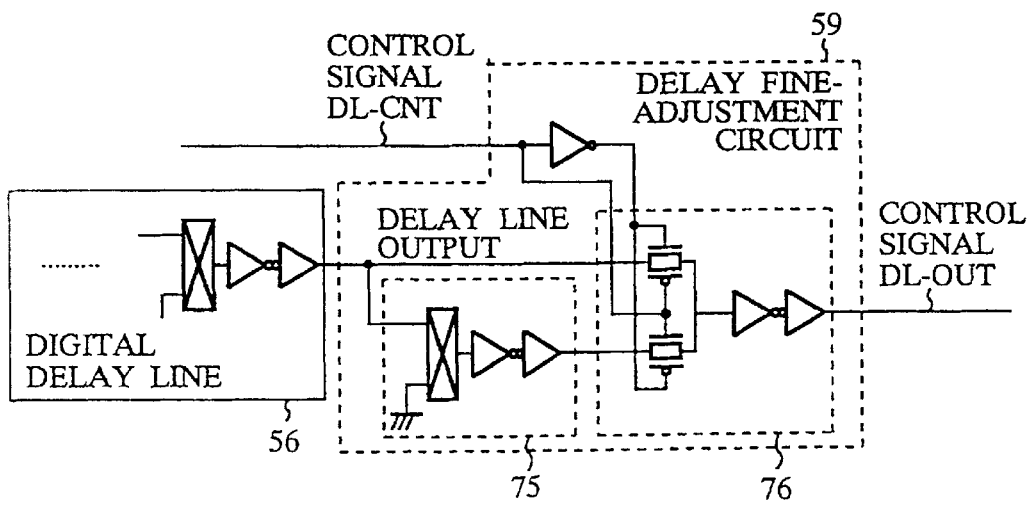
FIG. 4 is a circuit diagram showing the configuration of a delay fine-adjustment circuit.

FIG. 4 is a circuit diagram showing the configuration of a delay fine-adjustment circuit. In FIG. 4, the reference number 59 is a delay fine-adjustment circuit (first delay circuit), 75 and 76 denote delay elements.

Next, the operation of the delay fine-adjustment circuit 59 will be explained.

The delay fine-adjustment circuit 59 adds the delay time of the delay element 75 as one stage when the control signal DL-CNT is in the High level. Thereby, a fine adjustment of the delay time of the digital delay line 56 may be performed. The pulse width of one part in the four-multiplied output may be extended by one stage of the delay element in a same input clock cycle by switching the control signal DL-CNT output by the DL-CNT generation circuit 57 on the way of the input clock cycle.

The DL-CNT generation circuit 57 generates the control signal DL-CNT based on the lower three bit value of a 10-bit counter 52 and the values of the outputs C1 to C7 of the pulse counter 400.

FIG. 5 is a timing chart showing the relationship among the lower 3-bit value of the counter 52 in a multiple section 40, each of the control signals such as DL-CNT, C1 to C8, DL-ACT, and a four-multiplied output from the delay fine-adjustment circuit 59.

As shown in the timing chart of FIG. 5, all of the pulses as the four-multiplied output from the delay fine-adjustment circuit 59 have a same pulse width when the lower 3 bit value in the counter 52 of 10 bits is zero. When the lower 3-bit value in the counter 52 is increased gradually, for example, from 1 to 7, the pulse having the delay time width of one stage of the delay element in the delay fine-adjustment circuit 59 is outputted as the four-multiplied output from the delay fine-adjustment circuit 54.

When the counter value in the counter 52 is not changed during 20 cycles or more of the input clock, the lock detection circuit 60 (third counter) outputs a lock detection signal. When the rising edge of the input clock and the falling edge of the control signal DL-OUT are shifted to each other based on the change of a surrounding temperature, the level of a voltage, and other factors after the lock detection signal is asserted, the counter value in the counter 52 is increased or decreased by one in order to eliminate the shifted value according to the magnitude of the shifted value. Specifically, once the lock detection signal is asserted, the lock detection signal is not negated unless the control signal PLL-reset is inputted into the counter 52.

Next, the operation of the phase locked section 41 in the PLL 21 will be explained.

Figure 6:
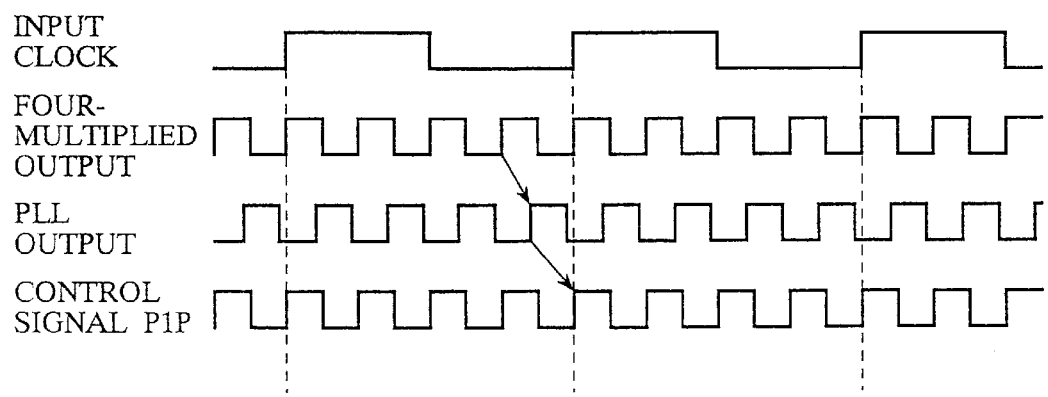
FIG. 6 is a timing chart showing the operation of a phase locked section.

FIG. 6 is a timing chart showing the operation of the phase locked section 41 in the PLL 21.

In the phase locked section 41, the four-multiplied output provided by the multiple section 40 is delayed by a desired time length by the two digital lines 69 and 71 (second delay circuits) in order to adjust both the phases of the input clock and the control signal P1P. The phase locked section 41 does not operate immediately following the reset and initiates its operation when the lock detection signal from the lock detection circuit 60 is asserted.

The counter 65 (second counter) in the phase locked section 41 controls the digital delay line 69 by using the upper 5-bit value and also controls the digital delay line 71 by using the lower 3-bit value. The digital delay line 71 has the configuration in which eight delay elements are connected in series that are also used in the digital delay line 56 in the multiple section 40. The digital delay line 69 has the configuration in which the 32-delay elements are connected in series. Each delay element in the digital delay line 69 has the delay time that is approximately six to eight multiple (the range of this multiple is changed based on the temperature, voltage and the variation of processes and so on) of each delay element forming the digital delay line 71.

In the phase locked section 41, the digital delay line 69 adjusts the phase of the input clock with the phase of the control signal P1P roughly and then the digital delay line 71 adjusts both the phases in detail.

The counter value of the counter 52 in the multiple section 40 when the lock detection signal from the lock detection circuit 60 is asserted is set to the counter 65 as an initial value.

The counter value of the counter 65 is increased or decreased by one according to the difference between the rising edge of the input clock and the falling edge of the control signal P1P. When both the phases are equal to each other, the counting operation by the counter 65 is halted. Specifically, when the phase of the input clock and the phase of the control signal P1P are shifted to each other after once the counting operation has been halted, the count value of the counter 65 is increased or decreased by one according to the magnitude of this shift value in order to match both the phases.

The meaning to set the counter value of the counter 52 in the multiple section 40 as the initial value is as follows:

In order to obtain an edge at which both the phases are locked certainly to each other in both cases of phase leading (decreasing the counter value) and phase delaying (increasing the counter value) when the operation of the phase locked section 41 is initiated, the delay time of a halt period is set in advance and the delay time of the digital delay line 69 is set within one period of the input clock when the phase locked section 41 is locked in order to obtain a highly lock performance.

If the lock operation is performed by using the delay time of two periods of the digital delay line 69 in the phase locked section 41, the following phase comparison operation is executed before the change of the counter value of the counter 52 in the multiple section 40 or the change of the counter value of the counter 65 in the phase locked section 41 is set on the control signal P1P. This causes to decrease the lock performance because it becomes difficult to perform the lock operation.

Next, a description will be given of the operations of the digital delay lines 56, 69, and 71 incorporated in the multiple section 40 and the phase locked section 41.

Figure 7:
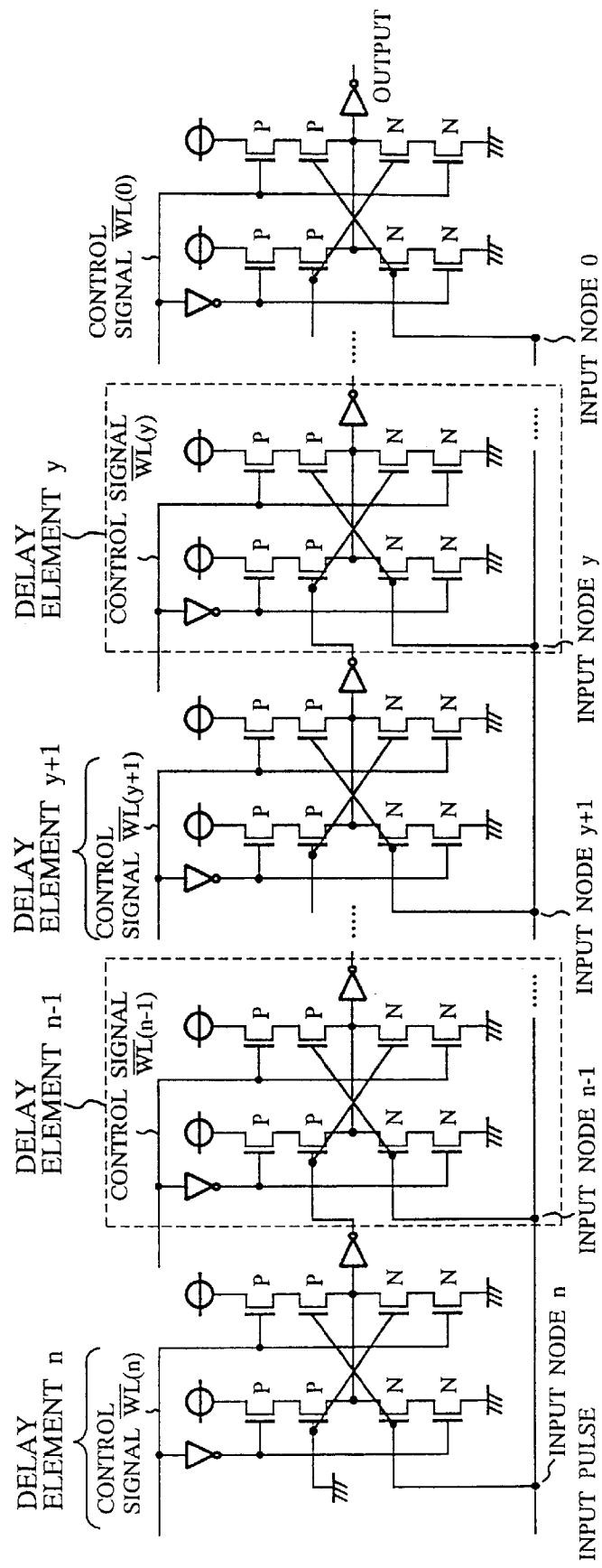
FIG. 7 is a circuit diagram showing the configuration of the digital delay line.
Figure 8:
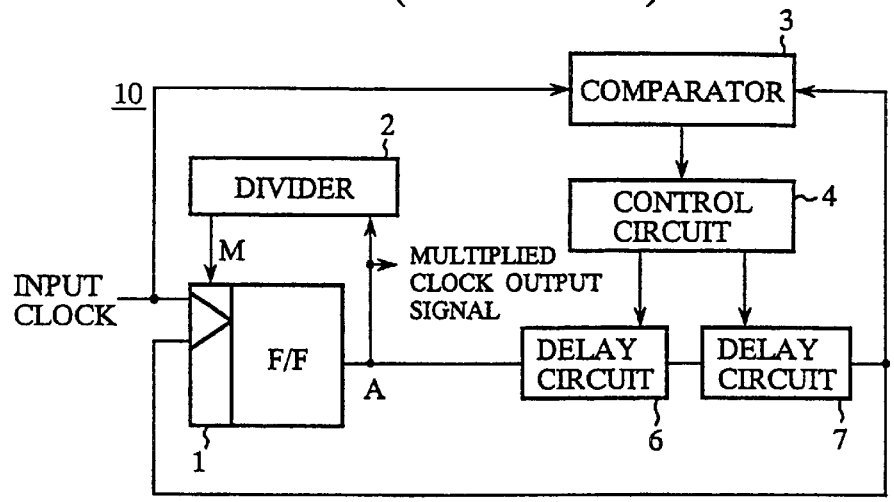
FIG. 8 is a block diagram showing the configuration of a conventional frequency multiplier 10.
Figure 9:
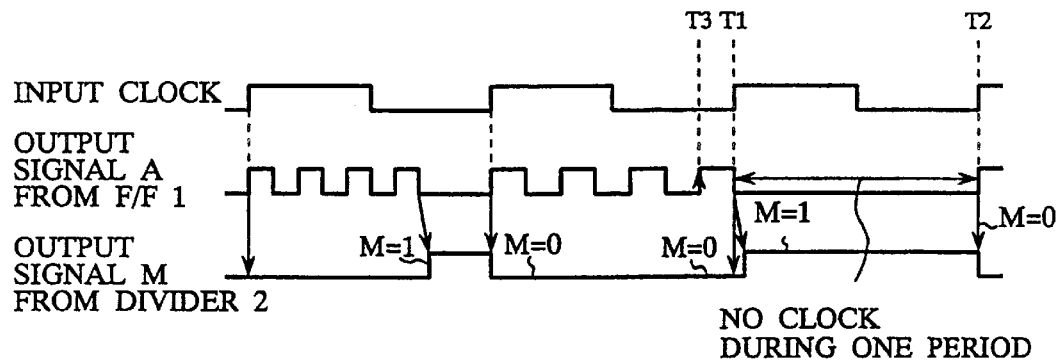
FIG. 9 is a timing chart showing the operation of the conventional frequency multiplier 10 shown in FIG. 8.
Figure 10:
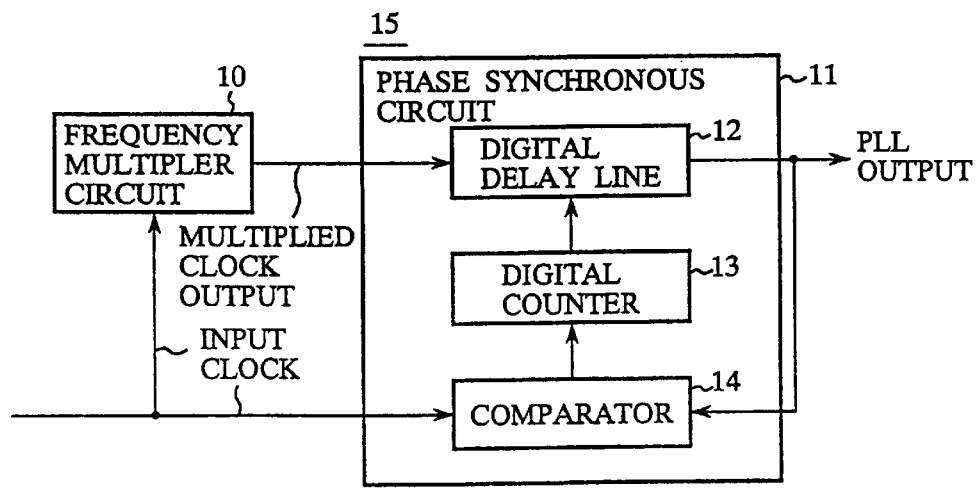
FIG. 10 is a block diagram showing a conventional clock generation circuit 15 that is obtained by combining the phase locked circuit with the frequency multiple circuit 10 using the digital delay line shown in FIG. 8.
Figure 11:
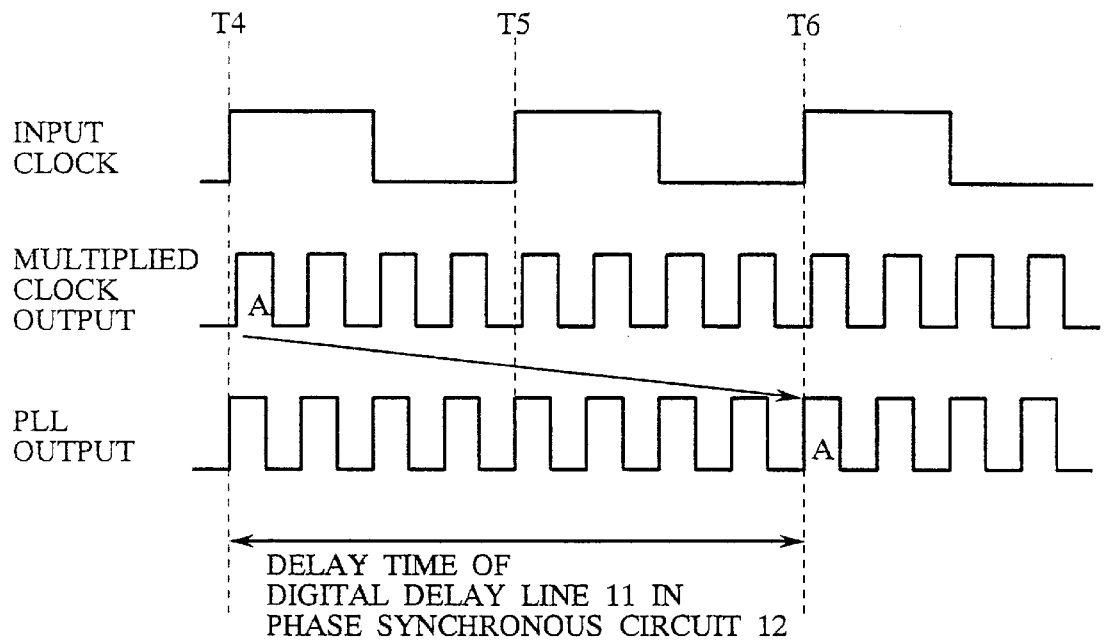
FIG. 11 is a timing chart showing the operation of the conventional clock generation circuit 15 shown in FIG. 10.
Figure 12:
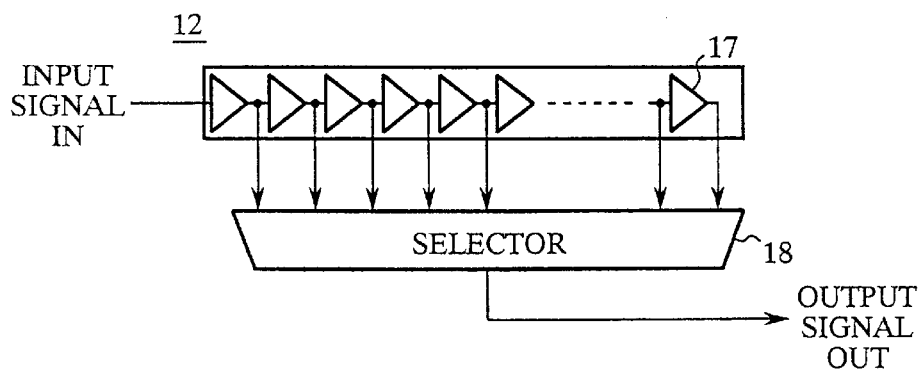
FIG. 12 is a block diagram showing the configuration of the conventional digital delay line 12.
Figure 13:
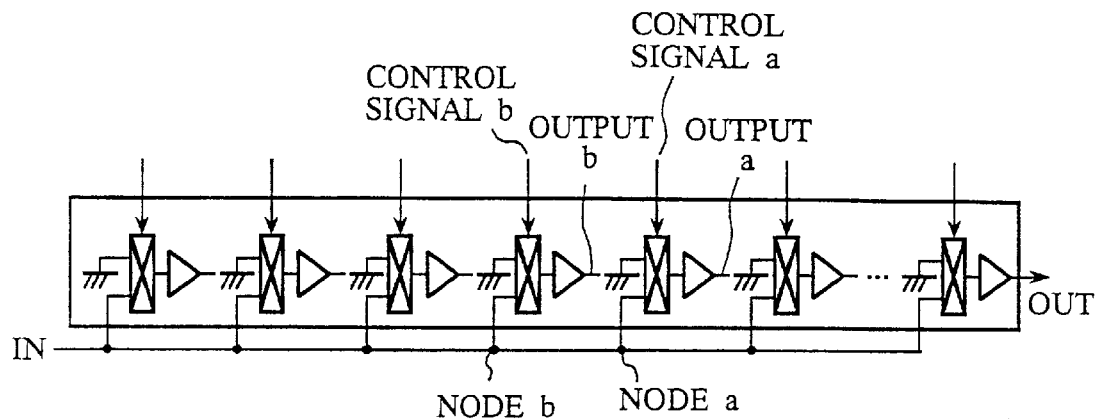
FIG. 13 is a diagram showing the configuration of another conventional digital delay line.

FIG. 7 is a circuit diagram showing the configuration of each of the digital delay lines 56, 69, and 71. In FIG. 7, each delay element i (i=0, . . . , y, y−1, . . . n−1, n) has the configuration in which two circuits connected in parallel, each circuit comprising two P-MOS transistors (P conductivity type Metal Oxide Semiconductor transistors) connected in series and two N-MOS transistors (N conductivity type Metal Oxide Semiconductor transistors) connected in series and both the two P-MOS transistors and the two N-MOS transistors are also connected in series.

In addition, as shown in FIG. 7, in each delay element, the gate terminals of both the P-MOS transistors and the N-MOS transistors that are located next to the connection nodes between the pair of the PMOS transistors and the pair of the N-MOS transistors in each delay element are connected to each other. Each delay element has an input node through which the input pulse is received. The digital delay line 56 in the multiple section 41 has the configuration in which 96 circuits (that is, n=95) are connected directly. The digital delay line 71 in the multiple section 41 has the configuration in which eight circuits (that is, n=7) are connected directly. Moreover, the digital delay line 69 in the multiple section 41 has the configuration in which 32 circuits (that is, n=31) are connected directly.

Next, the operation of the digital delay line will now be explained.

A desired delay element in each of the digital delay lines 56, 69, and 71 is selected by the control signal /WL(n) according to the counter value output from each of the counters 52 and 65 and the input pulse is inputted as the control signal into the input node i (i=0, . . . , y, y+1, . . . , n−1, n, where y, y+1, n−1, n are positive integer) of the selected delay element.

Thus, by changing the input node as the input position of the input pulse, the delay time of each of the digital delay lines 56, 69, 71 may be adjusted. When comparing with the conventional method in which the position of output terminal is changed, the method of the present invention to change the input position for the input pulse described above, there is an effect that it is possible to reduce the number of transistors to be used for the switching operation under a high frequency.

Figure 14:
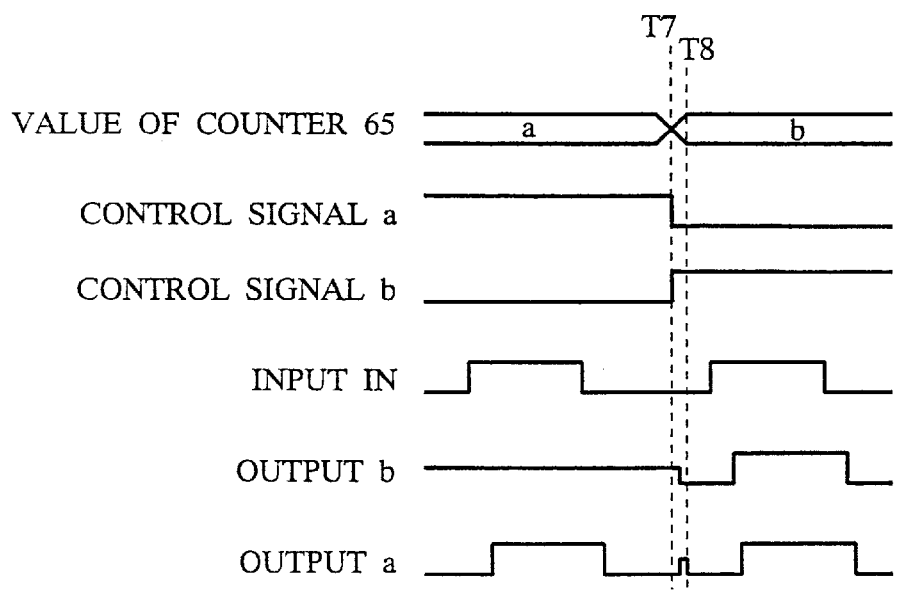
FIG. 14 is a timing chart showing the operation of the conventional digital delay line shown in FIG. 13.

When each counter value of each of the counters 52 and 65 is y, the input pulse is inputted through the input node y in the delay element y. In this case, because two control signals, namely the control signal /WL(y) and the control signal /WL(y−1) are asserted, the input pulse is received by the input nodes of both the delay elements y and y+1. It is thereby possible to avoid certainly an occurrence of the state in which an unstable voltage potential is caused on the output "a" from the timing T7 to the timing T6 shown in the timing chart of FIG. 14.

As descried above, according to the preferred embodiment of the present invention, the delay time of each digital delay line incorporated in the clock generator is set by the counter and the counter value of this counter to set the delay time of the digital delay line may be reset by using the reset signal provided from externals or reset when the number of pulses of the multiplied outputs from the multiple circuit during one period of the input clock is less than a predetermined multiple number. The counter value is set so that the delay time of the digital delay line has the minimum value immediately following the resetting operation and then is gradually increased. Therefore it can be achieved to control the operation of the clock generator under a lower voltage and it is possible to lock the output clock by the desired multiple number certainly. In addition, even if the initial value of the counter has any number, the clock generator can generate and provide a multiplied clock certainly. Furthermore, because the digital delay line can provide input pulses from both the delay element designated by the counter and the adjacent delay element, it is thereby possible to avoid faulty operation and to reduce the power consumption and to increase the compensation operation for variation of ambient temperature of the clock generator and the change of voltage and the like.

As set forth above in detail, according to the present invention, a clock generator comprises a multiple circuit for receiving an input clock signal and for generating and outputting an output clock signal of a desired multiplied clock signal. In the clock generator, an operation of the multiple circuit is initialized when a reset signal is transferred from outside or when the number of the output clock signals provided from the multiple circuit during one period of the input clock signal is less than a predetermined multiple number. It is thereby possible to have an effect that the clock generator generates a desired multiplied output clock signal accurately and certainly under a lower voltage and even if the counter value of the counter has any initial value.

In addition, according to the present invention, a clock generator comprises a multiple circuit for receiving an input clock signal and for generating and outputting an output clock signal of a desired multiplied clock signal. In the clock generator, the multiple circuit comprises a first delay circuit for delaying a period or a phase of the output clock signal gradually and a first counter for setting the delay time of the first delay circuit and for controlling an operation of the first delay circuit. In the clock generator, the counter value in the first counter is set so that the delay time of the first delay circuit has the minimum value when the operation of the clock generator is initiated or receives a reset signal provided from external. It is thereby possible to have an effect that the clock generator generates a desired multiplied output clock signal accurately and certainly.

Furthermore, according to the present invention, the counter value of the first counter is updated into the minimum value by which a change of the delay time of the first delay circuit has the minimum value. It is thereby possible to have an effect that the clock generator generates a desired multiplied output clock signal accurately and certainly by expanding a pulse width gradually.

Moreover, according to the present invention, a clock generator comprises a multiple circuit for receiving an input clock signal and for generating and outputting an output clock signal of a desired multiplied clock signal, the multiple circuit comprising a first delay circuit for delaying a period or a phase of the output clock signal gradually, and a first counter for setting the delay time of the first delay circuit and for controlling an operation of the first delay circuit, a phase locked circuit comprising a second delay circuit for receiving the output clock signal provided from the first delay circuit in the multiple circuit and for delaying the output clock signal by a predetermined time length, and a second counter for setting and controlling the delay time length of the second delay circuit. In the clock generator, the multiple circuit further comprises a third counter in which a second value is set when the initial value of the third counter is the first value and the counter value in the first counter is not changed during a predetermined time period. In the clock generator, the counter value of the third counter is changed from the first value to the second value, the counter value of the second counter is set so that the delay time of the second delay circuit becomes equal to or longer than the delay time of the first delay circuit. It is thereby possible to have an effect that an accuracy of the lock operation is increased by setting an initial value of a phase locked circuit by one period or more after the multiple circuit has been locked.

Furthermore, according to the present invention, a clock generator comprises a first delay circuit and a second delay circuit, each of the first delay circuit and the second delay circuit comprising a plurality of delay elements connected to each other in series. In the clock generator one of the plurality of delay elements is selected according to counter values transferred from a first flip flop circuit and a second flip flop circuit corresponding to the first delay circuit and the second delay circuit, and a delay time of each of the first delay circuit and the second delay circuit is determined by the selected delay element and an adjacent delay element next to the selected delay element. It is thereby possible to have an effect that an occurrence of a failure operation is avoided and the power consumption of a delay locked loop incorporating the clock generator is decreased.

Still further, according to the present invention, in the clock generator, each of the plurality of delay elements comprises two circuits connected in parallel, each of the two circuits comprises n PMOS transistors (n is a positive integer) connected in series and n NMOS transistors connected in series, and gates of a P MOS transistor and a NMOS transistor adjacent to a connection node of both the n PMOS transistors and the n NMOS transistors are connected to each other. It is thereby possible to have an effect that the power consumption of the clock generator is decreased.

Moreover, according to the present invention, in the clock generator, each of the first counter and the second counter comprises flip flop circuits and the third counter comprises a flip flop circuit of one bit. It is thereby possible to have an effect that the delay time period of each of the delay circuits is controlled easily under a lower voltage.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A clock generator comprising a multiplying circuit for receiving a pulsed input clock signal and for generating and outputting a pulsed output clock signal having a frequency that is a multiple of the frequency of the input clock signal, wherein the multiplying circuit comprises a delay circuit for delaying a period or a phase of the output clock signal gradually and a counter for setting delay time of the delay circuit and controlling operation of the delay circuit, wherein a count value is set in the counter so that the delay time of the delay circuit has a minimum value when the clock generator is initiated.

2. The clock generator as claimed in claim 1, wherein the count value of the counter is updated to the minimum value, as a result of which the delay time of the delay circuit has the minimum value.

3. The clock generator as claimed in claim 2, wherein the counter comprises flip flop circuits.

4. A clock generator comprising:

a multiplying circuit for receiving a pulsed input clock signal and for generating and outputting a pulsed output clock signal having a frequency that is a multiple of the frequency of the input clock signal, the multiplying circuit comprising:
    a first delay circuit for delaying a period or a phase of the output clock signal gradually; and
    a first counter for setting delay time of the first delay circuit and controlling operation of the first delay circuit,
a phase locked circuit comprising:
    second delay circuit for receiving the output clock signal from the first delay circuit and for delaying the output clock signal by a delay time; and
    a second counter for setting and controlling the delay time of the second delay circuit, wherein the multiplying circuit further comprises a third counter having a count value set to a second value when an initial value of the third counter is a first value and a count value in the first counter is not changed during a predetermined time period, wherein the count value of the third counter is changed from the first value to the second value, the count value of the second counter is set so that the delay time of the second delay circuit is at least equal to the delay time of the first delay circuit.

5. The clock generator as claimed in claim 4, wherein each of the first counter and the second counter comprises flip flop circuits and the third counter comprises a one-bit flip flop circuit.

6. A clock generator comprising a multiplying circuit for receiving a pulsed input clock signal and for generating and outputting a pulsed output clock signal having a frequency that is a product of a multiplier and the frequency of the input clock signal, wherein operation of the multiplying circuit is initialized when the number of pulses of the output clock signal from the multiplying circuit during one period of the input clock signal is less than the multiplier.

7. A clock generator comprising a multiplying circuit for receiving a pulsed input clock signal and for generating and outputting a pulsed output clock signal having a frequency that is a multiple of the frequency of the input clock signal, wherein the multiplying circuit comprises a delay circuit for delaying a period or a phase of the output clock signal gradually and a counter for setting delay time of the delay circuit and controlling operation of the delay circuit, wherein a count value is set in the counter so that the delay time of the delay circuit has a minimum value when the clock generator receives an external reset signal.

8. The clock generator as claimed in claim 7, wherein the count value of the counter is updated to the minimum value, as a result of which the delay time of the delay circuit has the minimum value.

\* \* \* \* \*